(12) United States Patent
Magrath

(10) Patent No.: US 7,257,164 B2
(45) Date of Patent: Aug. 14, 2007

(54) CLASS D AMPLIFIER

(75) Inventor: Anthony J. Magrath, Edinburgh (GB)

(73) Assignee: Wolfson Microelectronics plc, Edinburgh (GB)

(*) Notice: Subject to any disclaimer, the term of this patent is extended or adjusted under 35 U.S.C. 154(b) by 670 days.

(21) Appl. No.: 10/770,407

(22) Filed: Feb. 4, 2004

(65) Prior Publication Data
US 2005/0058209 A1 Mar. 17, 2005

(30) Foreign Application Priority Data
Sep. 15, 2003 (GB) .................................. 0321589.4

(51) Int. Cl.
H04B 14/06 (2006.01)
H04B 14/04 (2006.01)
H03M 1/00 (2006.01)

(52) U.S. Cl. ...................... 375/247; 375/254; 341/143

(58) Field of Classification Search ................ 375/242, 375/244, 247, 254; 341/76, 77, 143, 126
See application file for complete search history.

(56) References Cited

FOREIGN PATENT DOCUMENTS
GB        2 343 573 A     5/2000

OTHER PUBLICATIONS

Magrath et al., "Resolution Enhancement and Dither of Sigma-Delta Modulator Digital-to-analogue Converters," Electronics Letters vol. 31, No. 18, Aug. 31, 1995, pp. 1540-1542.*
Magrath et al., "Non-Linear Deterministic Dithering of Sigma-Delta Modulators," Institution of Electrical Engineers, 1995, pp. 1-6.*

A.J. Magrath et al. "Design and Implementation of a FPGA Sigma-Delta Power DAC", *IEEE*, Nov. 1997, pp. 511-521.
A.J. Magrath et al., "Power Digital-to-Analogue Conversion Using Sigma-Delta Puse Inversion Techniques", *99th Convention of the Audio Eng. Society*, Oct. 1995.
J. Vanderkooy, "New Concepts in Pulse-Width Modulation", Presented at AES 97th Convention, San Francisco, Nov. 10-13, 1994.
A.J. Magrath et al., "Performance Enhancement of Sigma-Delta Modulator D-A Converters using Non-linear Techniques" *IEEE*, 1996.
A.J. Magrath et al., "Digital Power Amplification using Sigma-Delta Modulation and Bit Flipping" *J. Audio Eng. Soc.*, vol. 45, No. 6, Jun. 1997, pp. 476-487.

* cited by examiner

*Primary Examiner*—Tesfaldet Bocure
(74) *Attorney, Agent, or Firm*—Dickstein Shapiro LLP

(57) ABSTRACT

The present invention relates to Class-D amplifiers, and in particular to bit-flipping sigma-delta modulator (SDM) implementations of such amplifiers. Such amplifiers are particularly although not exclusively suitable for audio equipment such as hi-fi and personal music amplifiers. The present invention provides a bit flipping sigma delta modulator (BF SDM) having a multiple feedback loop filter structure. The modulator comprises a quantiser coupled to a bit flipping means, a look ahead quantiser to determine the next quantiser output, and a controller which determines whether to change the output of the bit flipping circuit. The modulator comprises a feedback loop arranged to add feedback from the output of the modulator to its input. The modulator comprises compensation circuit to adjust the states of the modulator in order to correct for bit flipping of the output of the quantiser. This adjusts the input to the quantiser to correspond to an input having feedback from a non bit flipped quantiser output.

21 Claims, 15 Drawing Sheets

CLASS D AMPLIFIER

FIELD OF THE INVENTION

The present invention relates to Class-D amplifiers, and in particular to bit-flipping sigma-delta modulator (SDM) implementations of such amplifiers. Such amplifiers are particularly although not exclusively suitable for audio equipment such as hi-fi and personal music amplifiers.

BACKGROUND OF THE INVENTION

Class-D amplifiers utilise a switch element which is either fully on or off and which is switched at a high frequency with a duty cycle that is proportional to the amplitude of the input signal. This series of pulses is then applied to a low pass filter to provide an analogue output which corresponds to the input signal to the switch element. This analogue signal can then be applied to a speaker system for example.

The input to a Class-D amplifier is a series of digital words representing signal amplitude levels over time. A sigma-delta modulator or similar is typically used to convert these words into a series of bits or on/off pulses suitable for switching the switching element. FIG. 1 shows a schematic of a Class-D amplifier comprising an over-sampling filter 1, a modulator 2, a power switch 3, a low pass filter 4, and a headphone or loudspeaker load 5.

The over-sampling or interpolation filter adds additional samples from the incoming audio source samples by interpolating between the actual samples, thereby effectively increasing the sampling rate as is known. The over-sampled audio signal is fed to a modulator 2 such as a sigma-delta modulator. The modulator converts the signal into a one-bit output signal, the input signal modulating the output pulse density in the case of a sigma-delta modulator. The modulator also acts as a noise shaper moving in-band noise out of band. The series of pulses or bits control the power switch 3 which switches a much larger output voltage into a low pass filter 4 which turns this signal into an analogue signal as known for applying to the headphone or speaker load 5.

FIG. 2 shows a schematic of a sigma-delta modulator (SDM) comprising a quantizer Q and a loop filter H(z) in a feedback loop. The quantizer Q outputs a series of ones and zeros (1-bit, pulse or no pulse) depending on the level of its input value. The loop filter has high gain at low frequencies and is typically implemented as a low pass filter function such as an integrator for example. The SDM employs feedback around quantizer Q, so that the quantization noise power introduced into the baseband by the quantizing action of the quantizer is reduced, at the expense of greater noise power out of band.

A disadvantage of such amplifiers is that a zero or idle input signal requires the switching element to toggle between its maximum positive and negative output levels in order to maintain an average output level of zero. This results in high power dissipation in the switch. One approach to reducing this is to use bit-flipping in which some of the bits in the bit stream fed to the switch are flipped (ie changed from 1 to 0, or from 0 to 1) such that in the idle input signal situation for example, an average of zero is maintained but at a lower switching frequency. Thus a bit stream comprising: 1,0,1,0,1,0,1,0. . . is altered to: 1,1,1,0,0,0,1,1,1,0, . . .

FIG. 3 shows conceptually a bit-flipping modulator having a Quantizer Q, a loop filter H(z), a pulse inversion unit BF and a control unit C to determine when to flip the quantizer output. The quantizer is used to requantize the incoming 16-bit (or greater) wordlength into a 1-bit word to control the power switch. In common with "standard" (i.e. non bit-flipping) SDMs, the loop filter provides high gain over the baseband and by feedback action, attenuates the noise introduced by the quantizer in the baseband. The BF controller controls operation of the BF Unit, so that it inverts the state of the quantiser when this will reduce the transition rate of the bitstream.

FIG. 4 shows the circuit structure of a practical bit-flipping sigma-delta modulator in detail. The circuit comprises look ahead modifications including a look ahead quantizer $Q_{1a}$ and a delay element $z^{-1}$ between the input of the main quantizer Q and the input of the look ahead quantizer $Q_{1a}$. Thus the current (Q) and next ($Q_{1a}$) quantizer outputs are fed to the bit flipping control unit C.

The look-ahead modifications are needed by the bit-flipping control unit C to determine whether flipping the current quantizer Q output will reduce the transitions in the bit sequence. For example, if the quantizer Q output contains a bit pattern with previous, current and next outputs {1, 0, 0}, flipping the current quantizer output from 0 to 1 to produce pattern {1, 1, 0} will not reduce the transition rate. However the stability and SNR of the modulator will deteriorate. By predicting the next quantizer output, unnecessary bit-flipping can be avoided.

The feedback is taken from the output of the quantizer Q before the bit flipping unit BF, and thus the BF unit is taken out of the feedback loop. This is because the output of the look ahead quantizer $Q_{1a}$ must depend on the output of the quantizer Q (because of the feedback loop). If this were not the case, and all the feedback is taken from the bit flipping output, the look ahead quantizer output $Q_{1a}$ will depend directly on quantizer Q output, however the quantizer Q output depends on whether a decision is made to flip, which in turn depends on the output of the look ahead quantizer $Q_{1a}$. Hence there would be a dependency loop (delay-free loop) which cannot be implemented in practice. When the loop is taken from the output of the quantizer Q, the look ahead quantizer output $Q_{1a}$ is calculated from the current quantizer Q output, rather than the bit-flipping output. Thus, the output of the look ahead quantizer $Q_{1a}$ is the equivalent to the next value of the quantizer Q when no bit flipping occurs on the current quantizer Q output.

In order to accommodate the situation where bit flipping of the quantizer Q output does occur, further modifications within the sigma delta modulator circuit are required. Because bit flipping on the current sample will affect the next quantizer Q state (because of the feedback loop), the input to the quantizer Q is modified by the BF compensation circuit ($BF_{comp}$) shown whenever the previous quantizer Q output has been flipped. The BF compensation circuit ($BF_{comp}$) comprises a multiplexor or switch (M) which switches in an adder (A) which introduces an appropriate compensation signal (pulse) into the quantizer's Q input signal whenever the quantizer's Q output has been flipped by the bit flipping unit BF.

The loop filter H(z) also contains modifications over an equivalent loop filter in a non-BF SDM in order to implement the look-ahead algorithm. If a decision is made to flip the quantizer Q output, the state of the filter H(z) needs modifying since the loop filter has already responded to the quantizer's unflipped Q output. A modified filter is shown in FIG. 5.

More information on bit-flipping can be found in Anthony J. Magrath and Mark B. Sandler. "Digital Power Amplification Using Sigma-Delta Modulation and Bit-Flipping". Journal of the Audio Engineering Society, Volume 45, No. 6 Jun. 1997.

SUMMARY OF THE INVENTION

In general terms in one aspect the present invention provides a bit flipping sigma delta modulator (BF SDM) having a multiple feedback circuit architecture. The modulator comprises a quantiser coupled to a bit flipping means, a look ahead quantiser to determine the next quantiser output, and a controller which determines whether to change the output of the bit flipping means depending on the quantiser and look-ahead quantiser outputs. The modulator comprises a feedback loop arranged to add feedback from the output of the quantiser to its input. The modulator comprises compensation means to adjust the states of the modulator in order to correct for bit flipping of the output of the quantiser. This adjusts the input to the quantiser to correspond to an input having feedback from the flipped quantiser output.

The bit flipping means comprises circuitry or other means to provide one of a predetermined number of different outputs from the corresponding quantiser output when so instructed. The bit flipping outputs are possible outputs of the quantiser. For example with a bi-level quantiser having −1 and 1 outputs, the bit flipping means also has −1 and 1 level outputs, however when enabled, the bit flipping output is the opposite of the current quantiser output. In a tri-level modulator having a −1, 0 +1 outputs, if the current quantiser output is −1, then if instructed to "flip", the bit flipping output will be 0 or +1.

In particular in one aspect the present invention provides a bit-flipping sigma-delta modulator for a class D amplifier and comprising: a quantiser coupled to a bit-flipping means; one or more look-ahead quantisers; and a controller having inputs from the quantiser and the look-ahead quantisers and arranged to enable the bit-flipping means to provide a different output from that of the quantiser in order to reduce the quantised output transition rate of the modulator; a feedback circuit arranged to add a portion of the quantiser output to the input signal path of the modulator, and further comprising an integrator circuit in the input signal path between the input and the quantiser, the integrator circuit having a compensation circuit for adjusting the input to the quantiser when said previous modulator output has been changed by the bit flipping means from said previous quantiser output.

The feedback circuit provides a simple loop filter implementation which is cheaper than known arrangements, such as those using direct form loop filters for example.

In one embodiment the feedback circuit is further arranged to add one or more additional portions of the quantiser output to the input signal path of the modulator, and further comprising one or more corresponding integrator circuits in the input signal path between the input and the quantiser, the integrator circuits each having a compensation circuit for adjusting the input to the quantiser when said previous quantiser output has been changed by the bit flipping means.

By increasing the order of the modulator, noise in the baseband is reduced.

In another embodiment the feedback circuit is further arranged to add one or more additional portions of the output of the bit flipping means to the input signal path of the modulator, and further comprising one or more corresponding integrator circuits in the input signal path between the input and the quantiser.

By splitting the feedback path such that some feedback is taken from the quantiser output and some from the bit flipping means output, integrator structures using the bit flipping means output can be made simpler as they do not require the compensation means. Thus they can be used where a look ahead quantiser does not directly depend within the same sample—ie there is no delay-free loop between the bit-flipping output and any of the inputs to the control unit via the feedback path from the bit flipping output. For example in a split feedback structure, two levels of look ahead (two look ahead quantisers) require two integrator structures having compensation means.

Preferably the compensation circuit is arranged to remove said feedback portion from the input to the quantiser when said previous quantiser output has been changed by the bit flipping means. In one embodiment this is achieved by subtracting double the feedback portion added when flipping from +1 to −1 for example, as an error of −2 is introduced.

Preferably the feedback circuit is a multiple feedback filter circuit having multiple feedback paths from the output of the quantiser and having couplings to the inputs of the quantisers.

The modulator can be a bi-level or tri-level modulator, and when enabled said bit flipping means provides the or another state of the quantiser output as the changed output.

In one embodiment said portion is provided by switchable predetermined coefficients, said switching controlled by the output of the quantiser. This can be implemented by a multiplexer coupled to an adder and arranged to switch between two coefficients depending on the output of the quantiser.

Preferably the compensating means comprises two switchable paths through the integrator loop, one of said paths comprising an adder to add said compensating coefficient, the coefficient and path depending on the output of the quantiser.

More generally, the compensating means comprises circuit means within the loop of a said integrator circuit to switchably add a compensation coefficient derived from said quantiser output.

In one embodiment the controller comprises means for disabling the bit flipping means if the baseband noise resulting from enabling said bit flipping means is above a predetermined threshold.

Preferably the controller comprises means for estimating the baseband noise as a result of enabling said bit flipping means, said estimate being dependent on the difference between the input of the quantiser and the output of the bit flipping means. Preferably the noise estimate is dependant on the variance of said difference after baseband filtering.

The above defined modulators may be implemented in hardware, such as an ASIC or PLGA for example, or in software on a DSP platform for example, or a combination.

The present invention also provides class-D amplifiers comprising modulators as defined above. Said amplifiers may form part of audio equipment such as CD, DVD and MP3 players and recorders for example. They may also form stand alone hi-fi amplifiers for example.

In particular in another aspect the present invention provides a bit-flipping sigma-delta modulator for a class D amplifier and comprising: a quantiser which provides a quantised output based on an input sample, the quantiser being coupled to a bit-flipping means which is capable of changing the quantised output of the quantiser to provide a different quantised output as the modulator output; a look-ahead quantiser which determines the quantised output of said quantiser for the next input sample; a controller having inputs from the quantiser and look-ahead quantiser and arranged to enable the bit-flipping means to change the output of the quantiser in order to reduce the quantised output transition rate of the modulator; and a multiple feedback filter circuit having multiple feedback paths from the output of the quantiser and having couplings to the inputs of the quantisers, said circuit having means for adjusting the filter circuit to compensate for any bit-flipping of the quantiser output.

In particular in another aspect the present invention provides a bit-flipping sigma-delta modulator for a class D amplifier and comprising: a multiple feedback filter circuit coupled to a quantiser which is coupled to a bit-flipping circuit; a look-ahead quantiser; and a controller having inputs from the quantiser and the look-ahead quantiser and arranged to enable the bit-flipping means to provide a different output from that of the quantiser in order to reduce the quantised output transition rate of the modulator; the multiple feedback filter circuit having a compensation circuit for adjusting the input to the quantiser when the previous quantiser output has been changed by the bit flipping means.

In particular in another aspect the present invention provides a bit-flipping modulator for a class D amplifier, the modulator comprising: a quantising means for converting an N-bit word at an input of the modulator to a bit-stream at the output of the quantising means which is coupled to a bit-flipping means; a second quantising means for converting an N-bit word at an earlier sampling time at the input of the modulator to a bit-stream at the output of the second quantising means; the bit-flipping means is controlled by a bit-flipping controller which monitors the bit-streams from the first and second quantising means and controls the bit-flipping means to modify a bit in the bit-stream from the first quantising means if this will reduce the transition rate of said bit stream; and a loop filter coupled between the input of the modulator and the first and second quantising means, the filter forming part of a feedback loop between the output of the first quantising means and the input of the modulator; wherein the loop filter comprises multiplier free circuitry.

In general terms in another aspect the present invention provides a tri-level bit flipping sigma delta modulator. By providing three quantiser output levels, the maximum modulation index is improved. This arrangement can usefully be combined with the multiple feedback filter arrangement defined above and described in detail with respect to certain embodiments below.

In particular in this aspect the present invention provides a bit-flipping sigma-delta modulator for a class D amplifier and comprising: a quantiser which provides a quantised output based on an input sample, the quantiser being coupled to a bit-flipping means; a look-ahead quantiser which determines the quantised output of said quantiser for the next input sample; a controller having inputs from the quantiser and look-ahead quantiser and arranged to flip the output of the quantiser in order to reduce the quantised output transition rate; a filter circuit coupled to the input of the quantiser and having a feedback path from the output of the quantiser; wherein the quantiser has three output levels.

In one embodiment the filter circuit comprises multiple feedback filter circuit having multiple feedback paths from the output of the quantiser and having couplings to the inputs of the quantisers, said circuit having means for adjusting the filter circuit to compensate for any bit-flipping of the quantiser output.

In another embodiment a feedback circuit arranged to add a portion of the previous quantiser output to the input sample of the modulator, and further comprising an integrator circuit in the signal path between the input and the quantiser, the integrator circuit having a compensation circuit for adjusting the input to the quantiser when said previous quantiser output has been changed by the bit flipping means.

Preferably the feedback circuit is further arranged to add one or more additional portions of the previous quantiser output to the input sample of the modulator, and further comprising one or more corresponding integrator circuits in the signal path between the input and the quantiser, the integrator circuits each having a compensation circuit for adjusting the input to the quantiser when said previous quantiser output has been changed by the bit flipping means.

Alternatively or in addition the feedback circuit is further arranged to add one or more additional portions of the output of the bit flipping means to the input sample of the modulator, and further comprising one or more corresponding integrator circuits in the signal path between the input and the quantiser.

Preferably the compensation circuit is arranged to remove said feedback portion from the input to the quantiser when said previous quantiser output has been changed by the bit flipping means.

Preferably the feedback circuit is a multiple feedback filter circuit having multiple feedback paths from the output of the quantiser and having couplings to the inputs of the quantisers.

In one embodiment said portion is provided by switchable predetermined coefficients, said switching controlled by the output of the quantiser. This can be implemented by a multiplexer coupled to an adder and arranged to switch between two coefficients depending on the output of the quantiser.

Preferably the compensating means comprises two switchable paths through the integrator loop, one of said paths comprising an adder to add said compensating coefficient, the coefficient and path depending on the output of the quantiser.

In one embodiment the controller comprises means for disabling the bit flipping means if the baseband noise resulting from enabling said bit flipping means is above a predetermined threshold. This is known as weighted bit flipping.

Preferably the means for estimating the baseband noise as a result of enabling said bit flipping means, said estimate being dependent on the difference between the input of the quantiser and the output of the bit flipping means. Preferably the noise estimate is dependant on the variance of the difference after baseband filtering.

Preferably the controller comprises: a transition rate counter which provides a control signal when the transition rate of the quantised modulator outputs is above a predetermined level; an alternation control which provides a control signal when consecutive said differences enabled by the bit flipping means are within a predetermined number of increases or decreases; a transition control which provides a control signal when the inputs from the quantiser and look-ahead quantisers correspond to predetermined patterns; wherein the controller enables the bit flipping means when a control signal is provided by the transition rate counter, the alternation control, and the transition control simultaneously.

Preferably the transition rate counter increments when there is no difference between current and previous quantiser output, and decrements by an amount dependent on the sampling frequency when there is a difference between the current and previous quantiser output. The decrement amount is doubled when the difference is between the highest and lowest outputs.

Preferably said predetermined patterns correspond to the previous quantiser output being equal to the look first ahead quantiser output and not equal to the current quantiser output, or the previous quantiser output not being equal to the current quantiser output and equal to the second look ahead quantiser output.

In particular in another aspect the present invention provides an amplifier having a bit-flipping modulator comprising: a quantising means for converting an N-bit word at an input of the modulator to a bit-stream at the output of the quantising means which is coupled to a bit-flipping means; a second quantising means for converting an N-bit word at an earlier sampling time at the input of the modulator to a bit-stream at the output of the second quantising means; a loop filter coupled between the input of the modulator and the first and second quantising means, the filter forming part of a feedback loop between the output of the first quantising means and the input of the modulator; wherein the bit-flipping means is controlled by a bit-flipping controller which monitors the bit-streams from the first and second quantising means and controls the bit-flipping means to modify a bit in the bit-stream from the first quantising means if this will reduce the transition rate of said bit; wherein the modulator is arranged such that the bits in the bit-stream have three or more levels; the amplifier further having switching means arranged to provide three or more output levels corresponding to said bit levels.

There is also provided a D class amplifier comprising a tri-level BF SDM as defined above, and further comprising a bridge amplifier switch circuit coupled to a low pass output filter.

In general terms in another aspect the present invention provides a controller for a bit flipping sigma delta modulator for a class D amplifier. The controller uses a weighted bit flipping algorithm to determine whether to change modulator output from the output of the quantiser. The controller determines the baseband noise level changing the modulator output from the quantiser output would cause. If the baseband noise resulting from bit flipping would be above a predetermined threshold, then bit flipping is prevented.

This mitigates the additional noise introduced by the use of bit flipping, without having to increase the order of the output low pass filter in the class D amplifier. This aspect of the invention can usefully be combined with each or a combination of the above aspects.

In particular in one aspect the present invention provides a bit-flipping sigma-delta modulator for a class D amplifier and comprising: a quantiser which provides a quantised output based on an input sample, the quantiser being coupled to a bit-flipping means which is capable of changing the quantised output of the quantiser to provide a different quantised output as the modulator output; a look-ahead quantiser which determines the quantised output of said quantiser for the next input sample; a controller having inputs from the quantiser and look-ahead quantiser and arranged to enable the bit-flipping means to change the output of the quantiser in order to reduce the quantised output transition rate of the modulator; and a loop filter; wherein the controller comprises means for disabling the bit flipping means if the baseband noise resulting from enabling said bit flipping means is above a predetermined threshold.

Preferably the means for estimating the baseband noise as a result of enabling said bit flipping means, said estimate being dependent on the difference between the input of the quantiser and the output of the bit flipping means. Preferably the noise estimate is dependant on the variance of the difference after baseband filtering.

In one embodiment the loop filter is a feedback circuit arranged to add a portion of the previous quantiser output to the input sample of the modulator, and further comprising an integrator circuit in the signal path between the input and the quantiser, the integrator circuit having a compensation circuit for adjusting the input to the quantiser when said previous quantiser output has been changed by the bit flipping means.

Preferably the loop filter is a multiple feedback filter circuit having multiple feedback paths from the output of the quantiser and having couplings to the inputs of the quantisers, said circuit having means for adjusting the filter circuit to compensate for any bit-flipping of the quantiser output.

Preferably the controller comprises a transition rate counter which provides a control signal when the transition rate of the quantised modulator outputs is above a predetermined level; a weighted bit flipping control which provides a control signal when the baseband noise resulting from enabling said bit flipping means is below a predetermined threshold; a transition control which provides a control signal when the inputs from the quantiser and look-ahead quantisers correspond to predetermined patterns; wherein the controller enables the bit flipping means when a control signal is provided by the transition rate counter, the alternation control, and the transition control simultaneously.

Preferably the counter increments when there is no difference between current and previous quantiser output, and decrements by an amount dependent on the sampling frequency when there is a difference between the current and previous quantiser output. For a tri-level modulator, the decrement amount is doubled when the difference is between the highest and lowest outputs.

In one embodiment, for a tri-level modulator, said predetermined patterns correspond to the previous quantiser output being equal to the look first ahead quantiser output and not equal to the current quantiser output, or the previous quantiser output not being equal to the current quantiser output and equal to the second look ahead quantiser output.

The weighted bit flipping algorithm can be implemented using software or hardware such as an ASIC for example.

In particular in another aspect the present invention provides a bit-flipping modulator for a class D amplifier, the modulator comprising: a quantising means for converting an N-bit word at an input of the modulator to a bit-stream at the output of the quantising means which is coupled to a bit-flipping means; a second quantising means for converting an N-bit word at an earlier sampling time at the input of the modulator to a bit-stream at the output of the second quantising means; a loop filter coupled between the input of the modulator and the first and second quantising means, the filter forming part of a feedback loop between the output of the first quantising means and the input of the modulator; wherein the bit-flipping means is controlled by a bit-flipping controller which monitors the bit-streams from the first and second quantising means and controls the bit-flipping means to modify a bit in the bit-stream from the first quantising means if this will reduce the transition rate of said bit stream and will not increase the noise power in the resulting bit-stream.

The present invention also provides methods corresponding to the above defined apparatus, as well as computer programs corresponding to said methods.

DESCRIPTION OF THE INVENTION

Embodiments will now be described in detail with reference to the attached drawings, by way of example only and without intending to be limiting, in which:

FIG. 6b shows a detail of a look-ahead integrator structure for the modulator of FIG. 6a;

FIG. 8b shows a detail of an integrator structure for the modulator of FIG. 7a;

FIG. 8c shows a detail of a look-ahead integrator structure for the modulator of FIG. 7a;

DETAILED DESCRIPTION

Figure 1:
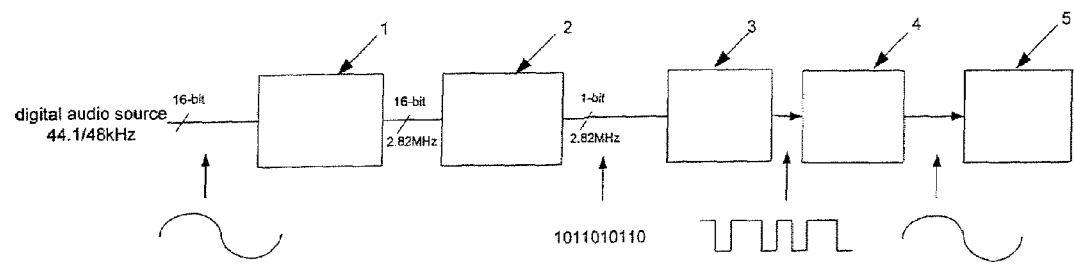
FIG. 1 shows a schematic of a class-D amplifier utilising a sigma-delta modulator.
Figure 2:
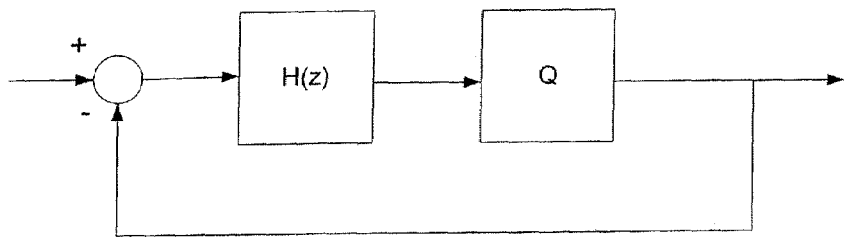
FIG. 2 shows a schematic of a sigma-delta modulator.
Figure 3:
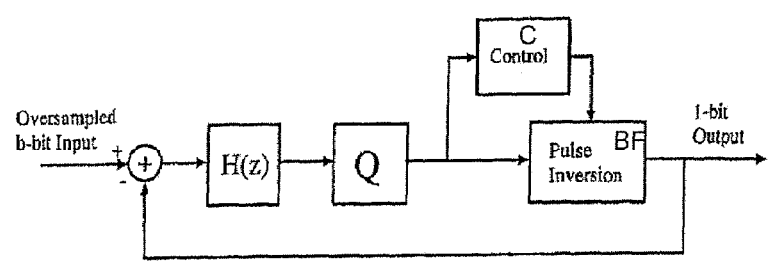
FIG. 3 shows a schematic of a bit-flipping modulator.
Figure 4:
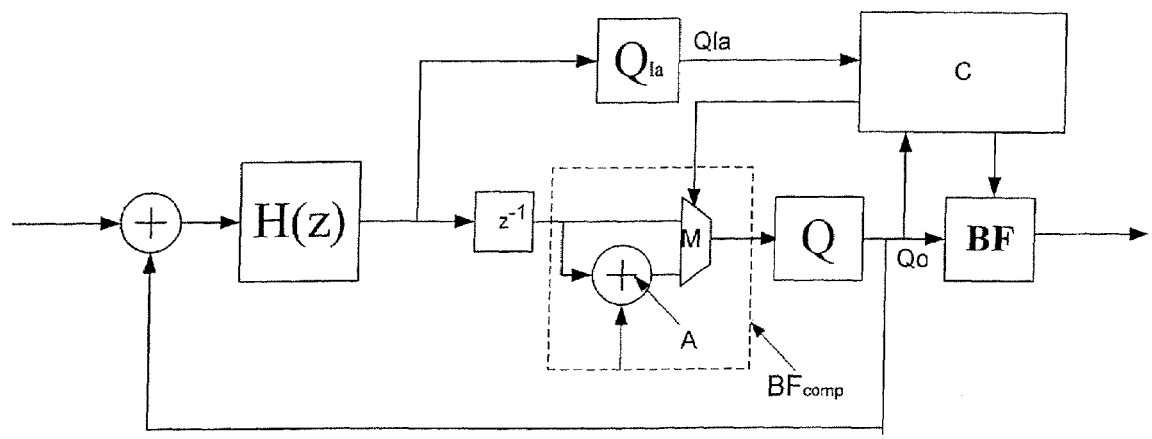
FIG. 4 shows a circuit diagram of a bit-flipping modulator using a look-ahead arrangement.

Various bit-flipping sigma-delta modulator (BF-SDM) architectures are described below. Referring again to FIG. 1, such modulators are used as part of a signal processing chain to convert a multi-bit digital input signal (e.g. 16-bit word) to a 1-bit (2 level) pulse sequence which can be used to control the power switch in a Class-D amplifier.

The oversampling filter 1 increases the sample rate of the incoming digital signal, to provide sufficient bandwidth for noise shaping. The BF-SDM 2 is based upon a sigma-delta modulator (SDM), which quantizes the (e.g.) 16-bit output of the oversampling filter 1 to a 1-bit signal. The bit-sequence at the output of the SDM is used to control the power switch 3, which produces pulses according to the bit-sequence. The output of the power switch is filtered by an L-C low-pass filter 4, which attenuates the out-of-band noise and acts to demodulate the audio signal so that it is converted to a voltage across the load 5, such as loudspeakers or headphones.

As described above, a BF-SDM 2 is a variant of a SDM, which reduces the transition rate of the bit-sequence in order to reduce the power dissipation in the power switch 3. SDMs are known for producing a high rate of transitions, especially in the idling (zero input) condition. The bit-flipping technique selectively inverts the state of the quantizer, so that bit-patterns such as 1010101010 are converted to 11100011100 for example. Thus bit flipping reduces the pulse repetition frequency (PRF) of the modulator output, and hence power dissipation in the class D amplifier.

Multiple Feedback Bit Flipping Architecture

Figure 5:
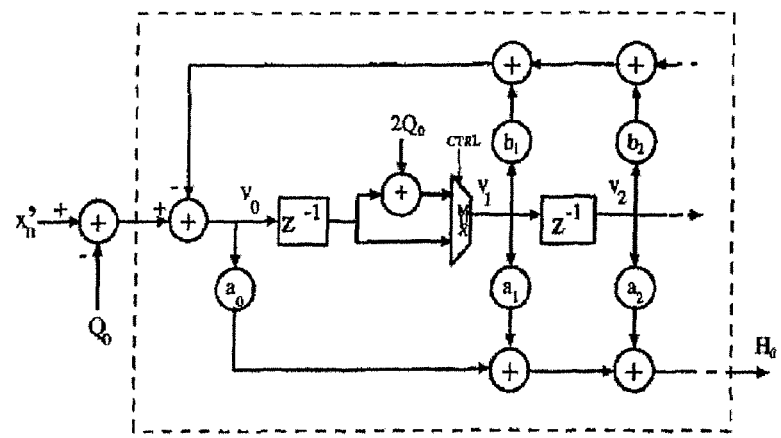
FIG. 5 shows a schematic of a loop filter architecture for a bit flipping sigma-delta modulator.
Figure 6A:
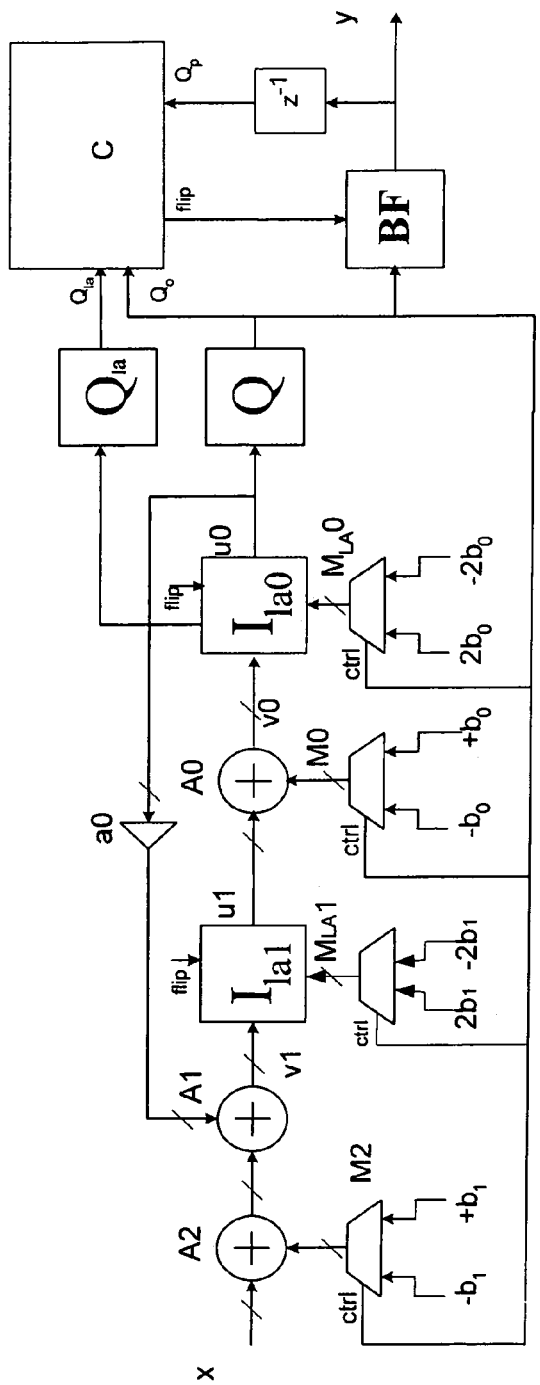
FIG. 6a shows a schematic of a modulator in accordance with an embodiment.
Figure 6B:
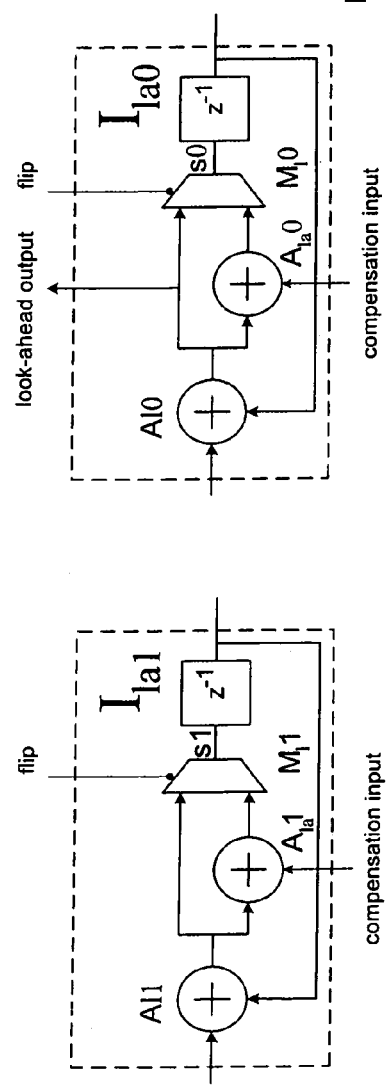

Referring to FIGS. 6a and 6b, a first embodiment BF-SDM architecture is shown for a second-order modulator with one level of look-ahead. The inventors have appreciated that multiple feedback (MFB) filter based SDM architectures can be used with bit flipping with suitable modifications. The architecture preferably utilises a multiplier free multiple feedback (MFB) arrangement by using multiplexers instead. Compared with the direct form filter approach of FIG. 5, this arrangement advantageously eliminates the need for multipliers which are expensive in terms of power consumption and silicon area used. Multiplexers have the further advantage that they allow the use of non-power-of-two coefficients, which gives greater flexibility in the design of the noise transfer function. Thus it allows arbitrary coefficients to be implemented without multipliers, due to the fact that the output of the quantiser is 1 or −1.

Alternatively, the multiplexers can be replaced with power-of-two multipliers which are efficient in hardware, but constrain the design of the noise-shaping function. By contrast, direct form filters require high accuracy of components for implementing the coefficients for example, which increases their cost. Specifically, the direct form filter requires higher word length data paths and coefficients compared to the multiple feedback arrangement.

Figure 7:
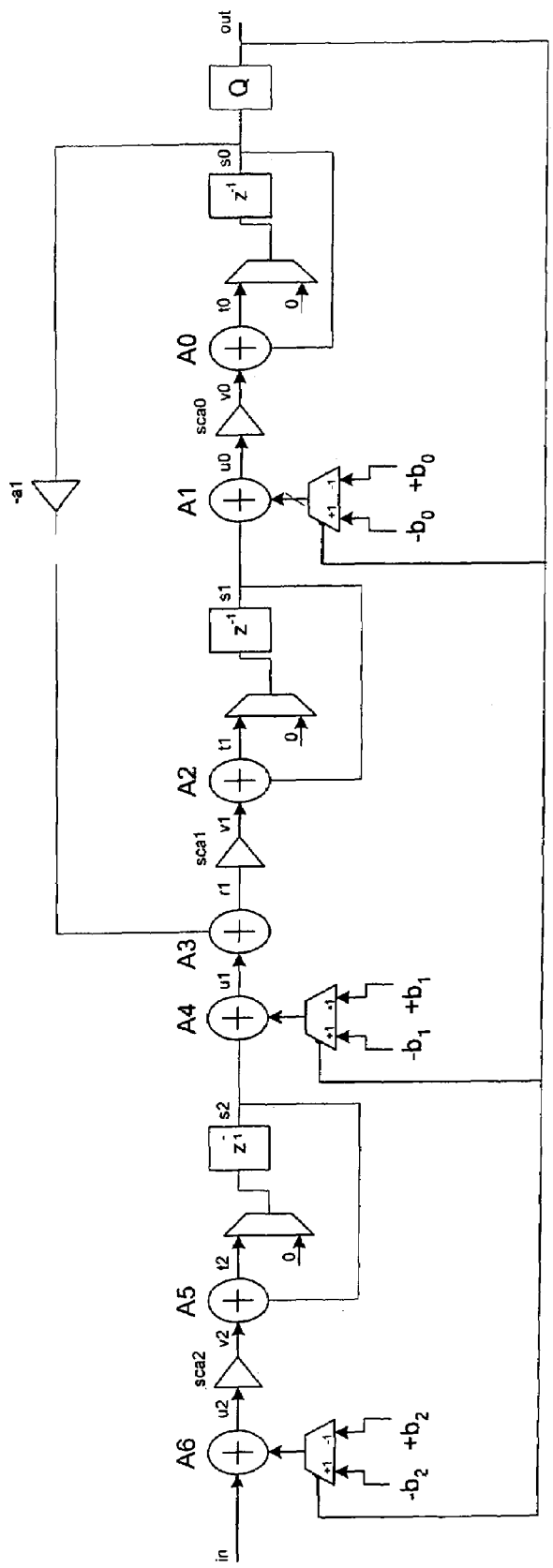
FIG. 7 shows a multiple feedback (MFB) architecture for a non-bit flipping sigma delta modulator.
Figure 10:
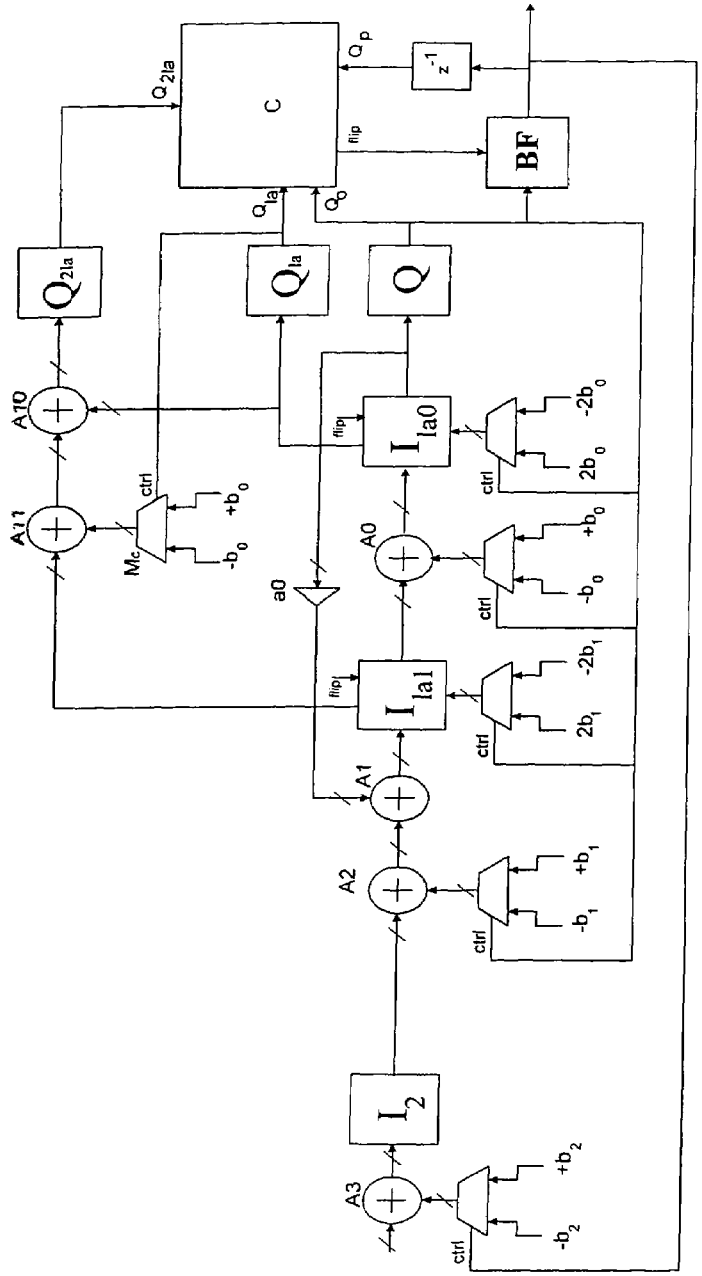
FIG. 10 shows a schematic of a third order modulator having two levels of look-ahead.

Multiple feedback (MFB) filter architectures are known for SDM, for example as shown in FIG. 7, which corresponds to FIG. 10.24 of Steven R. Norsworthy, Richard Schreies, Gabor Temes "Delta Sigma Data Converters, Theory, Design, and Stimulation" IEEE press—ISBN 0-7803-1045-4. However their implementation in a BF-SDM is non-trivial because of the need to compensate for the effects of bit flipping within the feedback loops and because of the need to incorporate the necessary look-ahead functionality.

Referring back to FIG. 6, in the case where bit flipping does not occur, the look ahead quantizer $Q_{1a}$ is fed from the output of adder $A_1 0$. Because there is no flip signal, this is identical to the delay input signal of the look ahead integrator $I_{1a} 0$ (signal s0). Hence $Q_{1a}$ is an advanced version of $Q_0$ and exactly represents the next quantizer output. The additional multiplexer $M_{1a}0$ does not influence the loop since the output of adder $A_10$ is deselected by the multiplexer $M_f0$.

In the case where bit flipping does occur, the quantizer output with respect to the loop changes state, and so the loop must be modified to respond correctly. This is because for some of the variables in the circuit, their state will be incorrect. Therefore changing these variables is essential to ensure that the effect of the bit-flipping is corrected by the operation of the modulator; in other words to effectively close the feed back loop around the BF unit to ensure that the bit flipping error is noise-shaped, as with the quantizer error. In particular, whilst the −b or +b coefficient added by adder $A0$ is correct for the feedback loop for $Q_{1a}$, it is incorrect for feedback for Q; and so is corrected by adding $2b_0$ or subtracting $(-)2b_0$ to remove the $-b_0$ or $+b_0$ coefficient from the input to Q. This is achieved by multiplier $M_10$ selecting adder $A_{1a}0$. Similarly, multiplexer $M_11$ and adder $A_{1a}1$ in look-ahead integrator $I_{1a}1$ compensate for the addition of $-b_1$ or $+b_1$ by adder A2 when the output of Q is flipped by BF.

Figure 8A:
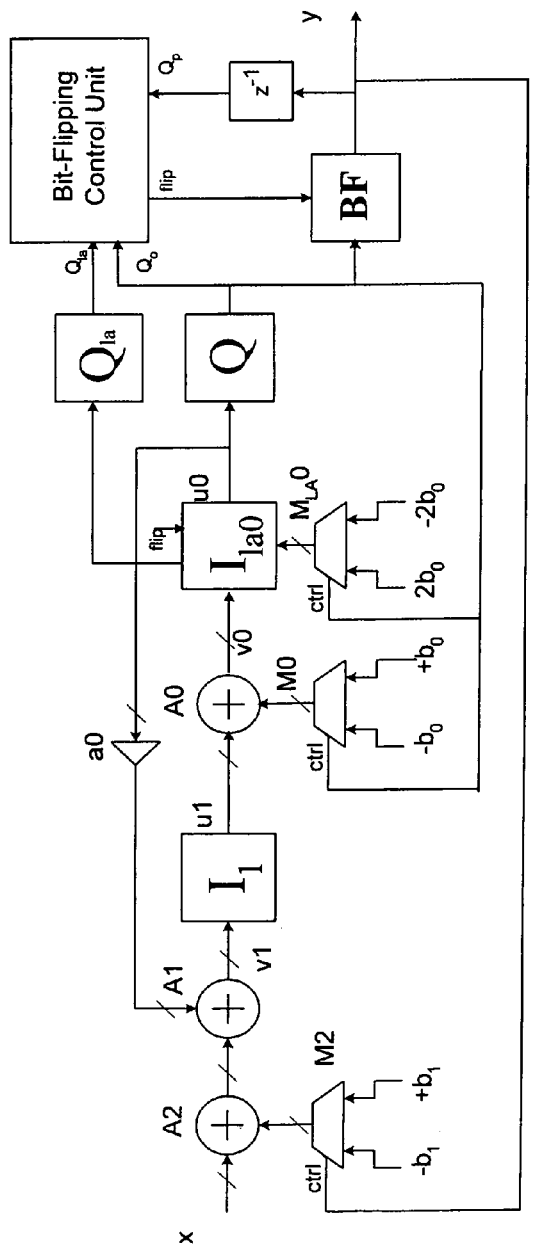
FIG. 8a shows a schematic of a modulator in accordance with another embodiment.
Figure 8C:
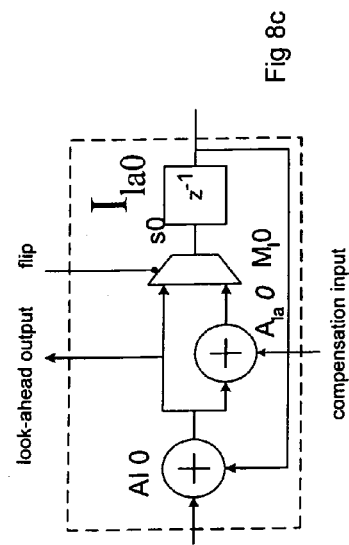
Figure 8B:
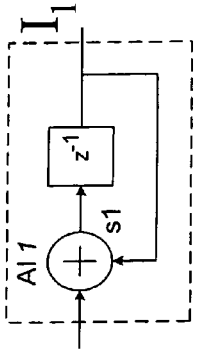

Referring to FIGS. 8a, 8b and 8c, a second BF-SDM architecture is shown for a second order modulator with one level of look ahead. This is similar to the first architecture, however the feedback loops have been split, one using the quantizer Q output, and the other using the bit-flipping BF output. Since $Q_{1a}$ does not depend directly on the input to the first integrator v1, the adder A2 can take its input from the bit flipping output directly, without producing any delay-free loops. This allows the hardware implementation to be simplified by removing one adder and one multiplexer ($A_{1a}0$ and $M_11$ of look ahead integrator $I_{1a}1$ from FIG. 6a—see the comparison between the standard integrator structure $I_1$ of FIG. 8b and the look ahead integrated structure $I_{1a}0$ of FIG. 8c. This advantage is enhanced with increasing modulator order.

In the case of no bit flipping, the two feedback paths have the same signal. In the case where bit flipping occurs, we need to ensure that the effect of the bit flipping is corrected by the operation of the modulator. Therefore we need to ensure that the state variables are the same whether or not bit flipping occurs.

In the case of no bit flipping:

$$s_1 = v_1 + u_1 = x + b_1q_0 + a_0u_0 + u_1$$

$$s_0 = v_0 + u_0 = u_1 + b_0q_0 + u_0.$$

If bit flipping occurs, then the state variables are as follows:

$$s_1 = v_1 + u_1 = x - b_1y + a_0u_0 + u_1 = x + b_1q_0 + a_0u_0 + u_1$$

$$s_0 = v_0 + 2b_0q_0 + u_0 = u_1 - b_0q_0 + 2b_0q_0 + u_0 = u_1 + b_0q_0 + u_0.$$

Therefore the state variables are the same by utilizing the compensation coefficients shown ($-2b_0$, $+2b_0$). Multiplexer $M_{LA}0$ is arranged such that it selects $2b_0$ for the Q value that causes M0 to select $-b_0$, and similarly selects $-2b_0$ when M0 selects $+b_0$.

Figure 9:
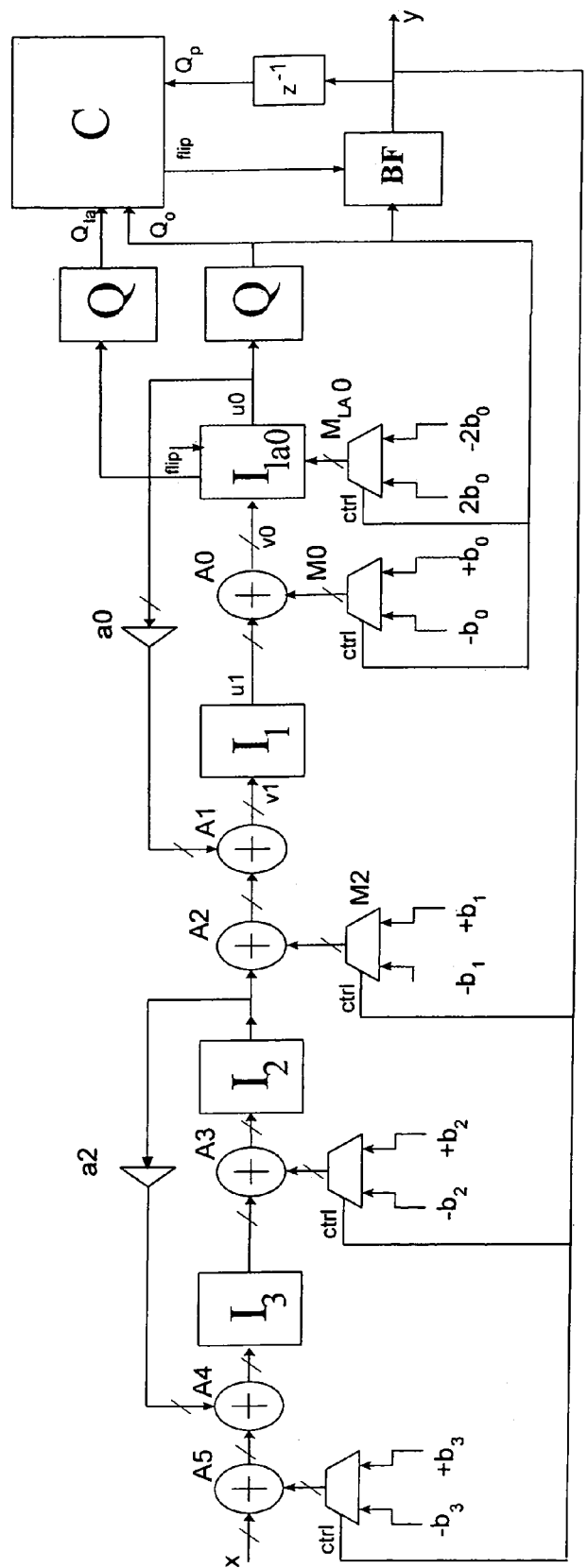
FIG. 9 shows a schematic of a fourth order modulator having one level of look-ahead.

This architecture can be extended to higher orders by feeding the input through more integrating states as described in more detail below. This also applies to the first architecture of FIG. 6A. Higher order filters are advantageous in bit flipping architectures because bit flipping introduces additional noise in the base band and higher order modulators compensate for this by reducing noise in the base band. A fourth order modulator with one level of look ahead is shown in FIG. 9.

Alternatively, a single order modulator having a single look-ahead integrator structure can be implemented in order to reduce implementation complexity and cost.

These architectures can also be modified to use variations on the multiple feedback MFB filter structure. For example, if power-of-two coefficients are used, the feedback multiplexers of the MFB structure can be eliminated and replaced by shifters. This results in a reduction in circuit complexity, at the expense of tighter constraints in the design of the noise shaping filter.

A further BF-SDM architecture is shown in FIG. 10 which contains two levels of look-ahead and provides a third-order modulator. Compared with the one-level look-ahead implementation of FIG. 8, an additional quantizer $Q_{2LA}$ is used to produce the two level look ahead output. This quantizer $Q_{LA2}$ produces a two-sample-advance version of $Q_0$, assuming that no bit flipping occurs in the current or next sample. $I_1$ is replaced by a look ahead integrator $I_{1a}1$. Feedback is taken from $Q_0$ to both $I_{1a}1$ and A2. These changes are necessary because the value of $Q_{2LA}$ depends directly on the output of adder A2, hence if the feedback loop is not split, a zero-delay loop will occur. The operation is a logical extension of the one-level look ahead case.

The 2-level look-ahead output $Q21a$ is found by an advanced calculation of the filter output. The calculator comprises adders A10 and A11, and an associated multiplexer $M_c$. The input to the calculation is the current state of I1a1, I1a0 and the Q1a output. This circuit performs the same calculation that would have been performed by A0 and I1a0 in the next sample. Again $Q21a$ represents the quantizer output only if bit-flipping does not occur, since the feedback signal is derived from the quantizer output rather than the BF output. If the decision is made to bit-flip the quantizer output, the filter state in I1a1 is corrected in the same way as with I1a0.

The additional adders A10 and A11 and associated multiplexer calculate the value of $Q_{2LA}$ by determining the next value of $Q_{LA}$, again assuming no bit flipping occurs. $Q_{LA}$ is the quantized value of $s_0(z)$, which is obtained (referring to the diagram) as follows:

$$s_0(z)=z^{-1}s_0(z)-b_0Q_0+z^{-1}s_1(z)$$

The next value $Q_{LA}$ can therefore be found by quantizing the next value of $s_0$:

$$zs_0(z)=s_0(z)-zb_0Q_0+s_1(z)$$

The future value of $b_0Q_0$, assuming no bit flipping occurs, is the same as $b_0Q_{LA}$, and hence:

$$zs_0(z)=s_0(z)-b_0Q_{LA}+s_1(z).$$

This equation is implemented using A10, A11 and the associated logic.

In order to reduce system complexity it is assumed that the future bit-patterns with bit-flipping are the same as the bit-patterns without bit-flipping. Simulations show that acceptable performance is achieved.

However for greater performance, the QLA and Q2LA outputs with and without bit-flipping are determined, then a decision made whether to bit-flip, based on the reduction in transitions that occurs between the two cases.

Figure 11A:
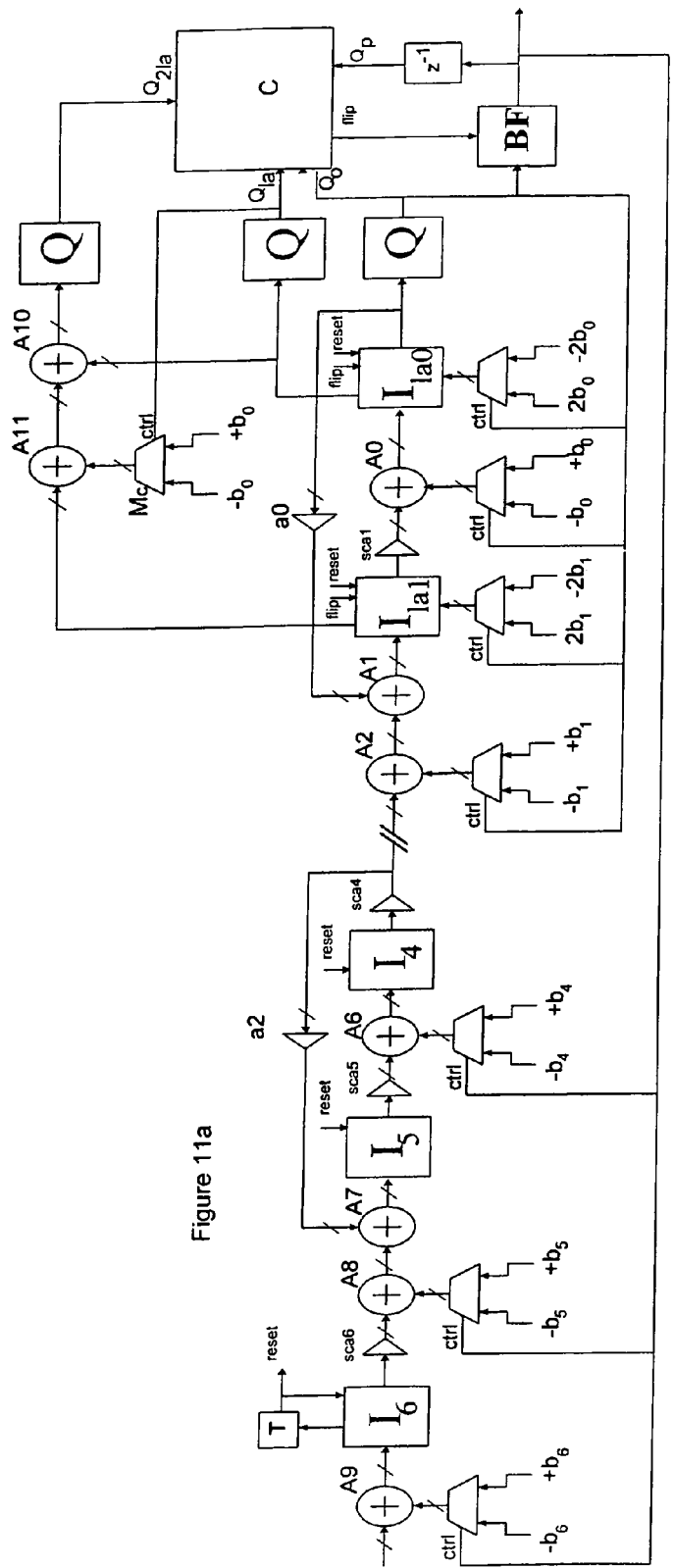
FIGS. 11a, 11b and 11c show respectively a schematic of a fourth order modulator having two levels of look-ahead, together with details of the standard and look-ahead integrator structures used in the modulator.
Figure 11C:
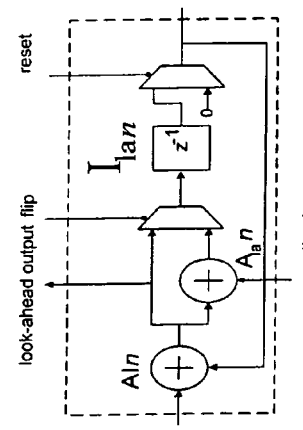
Figure 11B:
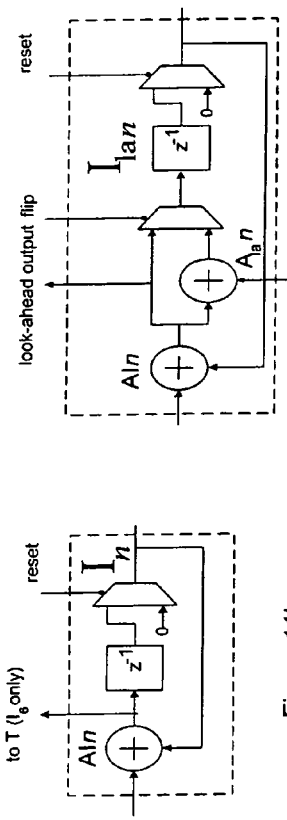

Referring to FIG. 11, a further embodiment is shown in which a BF-SDM architecture has two levels of look ahead and provides a fifth-order modulator. This architecture is modified, compared with that of FIG. 10, by using the introduction of scaling factors scan. The scaling factors are used to ensure that the output of each integrator has a similar dynamic range. The scaling is also used in a standard sigma-delta modulator to ensure that the output of each integrator has a similar dynamic range.

The architecture also comprises reset circuitry associated with the integrator. This circuitry resets the system if the modulator becomes unstable. The resets are triggered by a monitor on one or all of the integrators, which sends a signal to do the reset if one or more of the signal thresholds are exceeded. The reset circuits may alternatively be replaced by limiters, which also has the effect of preventing instability.

As a further alternative, the feedback paths containing scaling functions a0, a2 etc., may be taken from the integrator signals $s_N$, i.e. before the delay. Alternatively, these feedback paths may be eliminated altogether. These paths implement the zeros of the noise transfer function. By eliminating them the zeros will be at DC rather than spread across the baseband.

Two levels of look ahead allows more intelligent bit flipping to occur by considering longer sequences of quantiser outputs, and thereby further reducing PRF. Additional levels of look ahead could also be implemented by extending the multiple feedback filter structure of the above-described embodiments.

Tri-Level SDM

Sigma-delta and bit-flipping techniques suffer the disadvantage that the maximum modulation index to the modulator is restricted because it directly relates to the input level to the modulator. With SDM and BF-SDM, it is generally difficult to achieve a modulation index greater than 0.5 relative to full scale. By comparison, pulse width modulation (PWM) systems can operate with modulation indexes of 0.8-0.9. This means that for the same power supplies and output stage configuration, the output power from the amplifier is only around a third of what could be achieved using a PWM amplifier.

Figure 12:
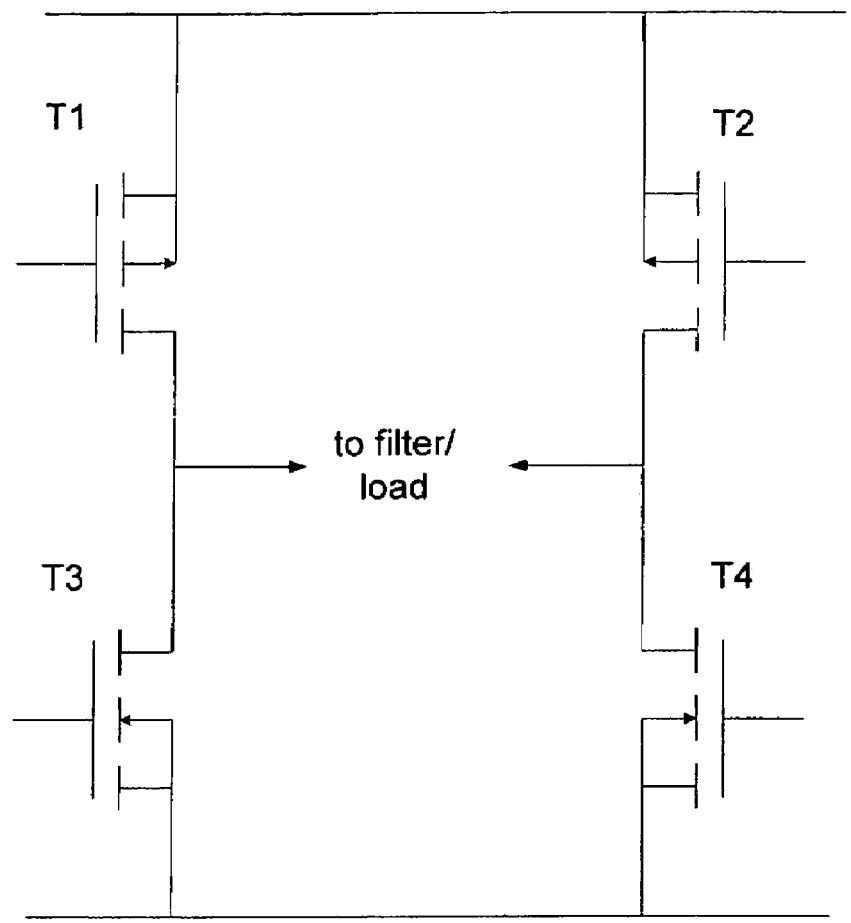
FIG. 12 shows an output bridge amplifier for a tri-level embodiment.

The inventors have appreciated that tri-level modulation combined with sigma-delta modulation offsets the maximum modulation index disadvantage these types of modulators have compared with Pulse-width Modulation (PWM) based Class D Amplifiers. Tri-level modulation can be realised in the output stage using a bridge amplifier, as shown in FIG. 12. High and low states are achieved with diagonally opposite MOSFETs conducting (T1 and T4, T2 and T3 respectively). The zero state is achieved with either the top two (T1 and T2) or lower two MOSFETs (T3 and T4) conducting. For positive input signals, the output oscillates between the high and zero state, and for negative input signals, the output oscillates between the low and zero state. This means that only two out of the four transistors are operational during each half-cycle. Consequently, tri-level modulation in sigma-delta and bit-flipping amplifiers offers a substantial improvement in power efficiency over bi-level modulation.

Tri-level Class D amplifiers can known to be implemented using PWM. However, a drawback of tri-level PWM is that for signals close to zero, the minimum pulse width can be in the order of 10 ns. With current technology it is almost impossible to achieve transition times in the output stage which are fast enough to allow the output to rise and fall within 10 ns. More information on tri-level modulation as applied in PWM systems can be found in J. Vanderkooy "New Concepts in Pulse Width Modulation", $97^{th}$ Audio Engineering Society Convention", Nov. 10-$13^{th}$ 1994.

Figure 13A:
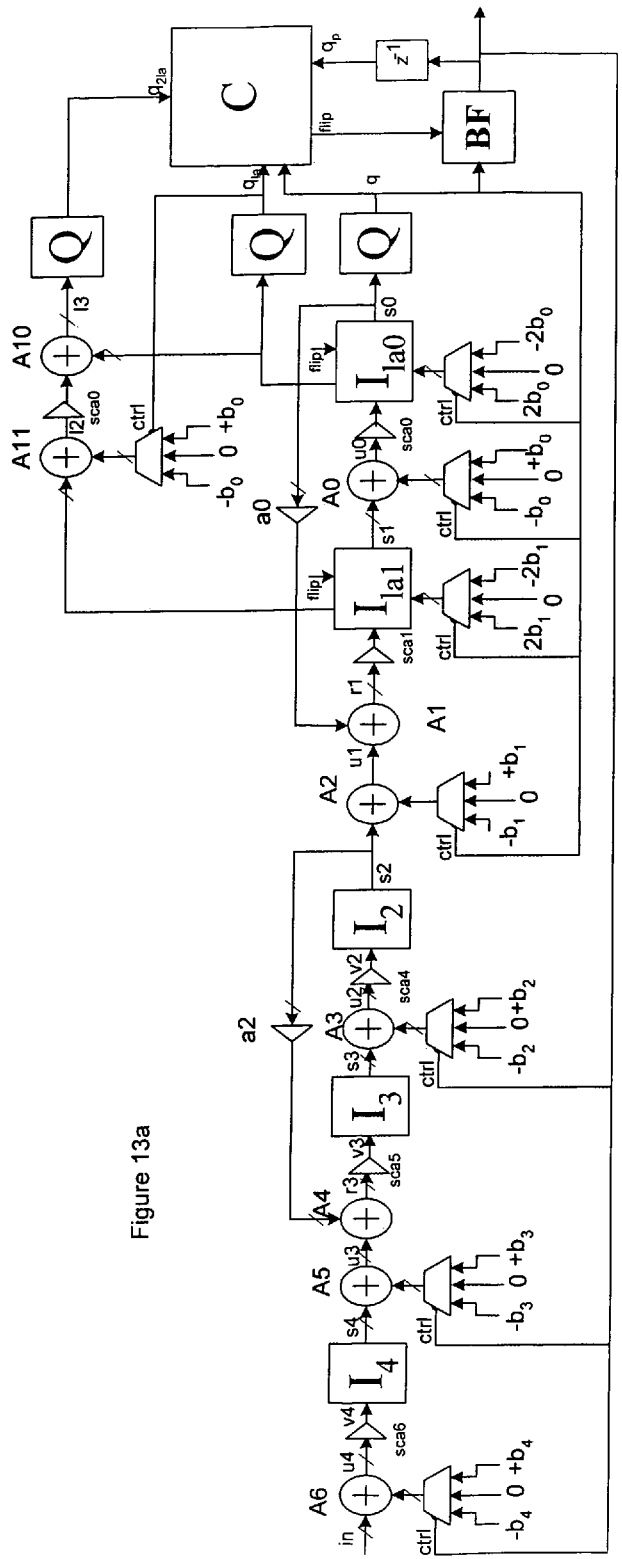
FIGS. 13a, 13b and 13c show respectively a schematic of a fifth order tri-level modulator having two levels of look-ahead, together with details of the standard and look-ahead integrator structures used in the modulator.
Figure 13B:
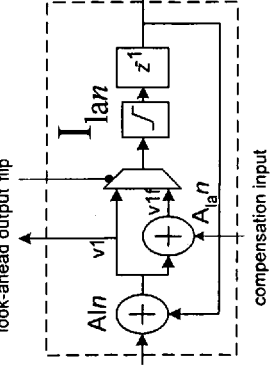
Figure 13C:
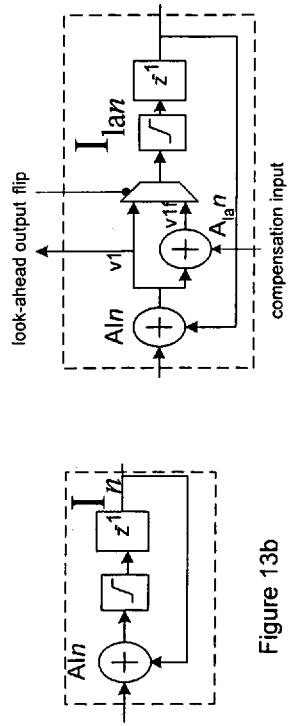

By contrast tri-level SDM offers minimum pulse widths in the order of 350 ns, which poses no problems for the output stage. A tri-level bit-flipping SDM modulator is shown in FIG. 13. Compared with the previously described embodiments, the modifications are to the feedback multiplexers and BF control unit.

All the quantizers have three states: +1, 0, −1. Due to the additional state, the feedback multiplexers are modified to take in three inputs i.e. either the positive coefficient, negative coefficient or zero is used. This assumes that the controller disallows bit-flipping from −1 to +1 and vice versa. In the case where −1 to/from +1 bit-flipping is allowed, the multiplexers are extended to 5 possible compensation coefficients (4bo, 2bo, 0, −2bo, −4bo). Also where scaling is used such as shown in FIG. 11, appropriate modifications must be made to scale the coefficients.

Tri-level quantisers have three outputs levels, and an upper and lower input threshold which can be made variable. If the input exceeds a constant (threshold B), then an output of +1 is chosen. If the input is less than −B, then an output of −1 is chosen. Otherwise the output is zero. The value of the threshold B determines how often the zero state is used. If B=0, then the zero state is never used and the modulator becomes bi-level.

Whilst the above tri-level embodiment has been described with respect to an MFB filter architecture based BF-SDM, a bit flipping direct form filter based SDM could be implemented to utilise this tri-level approach.

Bit Flipping Controller

Figure 14:
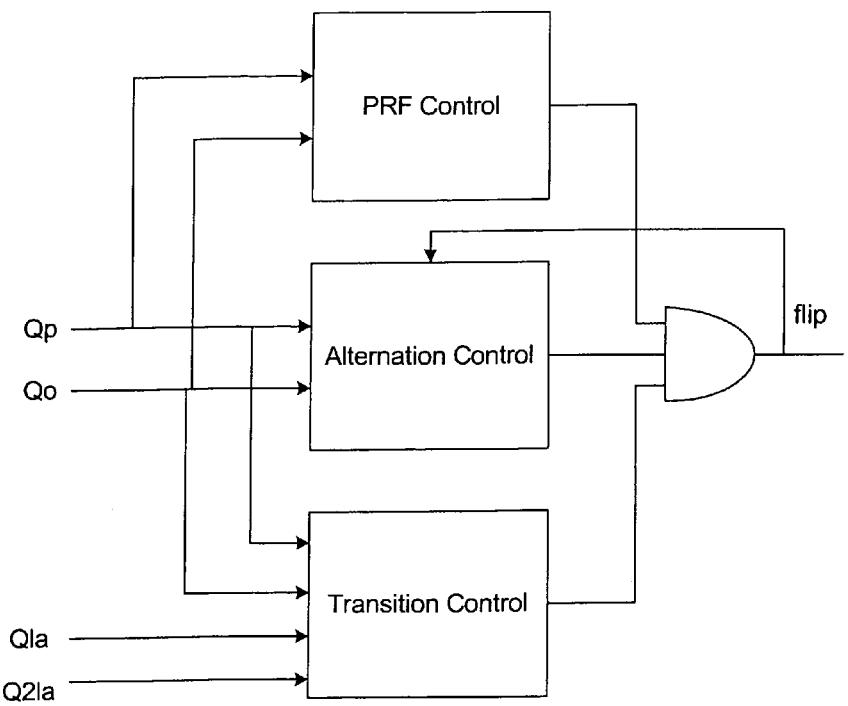
FIG. 14 is a schematic of a controller for a bit flipping modulator.

The Bit-Flipping Controller controls the operation of the bit-flipper to reduce the PRF to (preferably) a constant rate, whilst maintaining acceptable noise performance and stability margins. The Controller implements three independent sub-controllers to achieve the necessary performance as shown in FIG. 14. Each output TRUE if the necessary conditions are satisfied. The "flip" signal is obtained by ANDing the three outputs.

1. PRF Control—this counts the number of transitions in the bit-stream and makes the decision on when it is necessary to reduce the transition rate, in order to meet a target PRF.
2. Alternation control. This shapes the error introduced by the bit-flipping, to maintain a high-pass characteristic, by introducing a zero at DC. This is achieved by ensuring the DC component of the error is zero.
3. Transition control. This determines whether bit-flipping on the current sample will reduce the transitions by using the previous, current and look-ahead quantizer outputs.

The PRF control is a counter which on every sample counts up 1 if there is no transition between the previous and current sample, and down K if there is a transition between the previous and current sample. The output is TRUE if the counter value is less than zero (msb=1 in 2's complement arithmetic).

For a sampling frequency $F_s$, and desired maximum PRF, the value of K is given by: $K=(LF_s/2PRF)-1$ where L is oversampling ratio.

Figure 15:
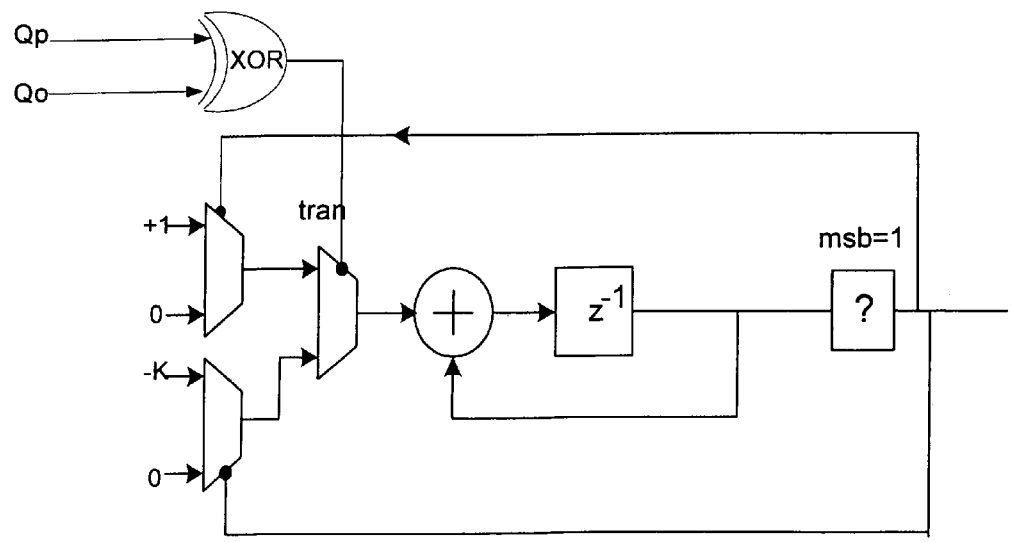
FIG. 15 is a circuit architecture for the pulse repetition frequency (PRF) control for the controller of FIG. 14.

An implementation of the PRF control is shown in FIG. 15. The signal tran is used to select the lower multiplexor when a transition occurs. The counter may also contain a limiter (not shown), which ensures that the value of the counter is bounded.

The alternation control shapes the error introduced by the bit-flipping with a high-pass characteristic to minimise the noise introduced into the baseband. The algorithm operates by limiting the maximum number of consecutive negative (1 to −1) or positive (−1 to 1) flips. For example an alternation constraint A=1 enforces that each positive flip is followed by a negative flip and vice-versa. Similarly A=2 allows a maximum of two positive flips before enforcing that the next flip is negative. A state-machine can be used to implement this.

The transition control detects bit-patterns at the output of the quantizers $Q_p$, $Q_o$, $Q_{1a}$ and $Q_{21a}$ respectively, using combinatorial logic which outputs TRUE when certain bit-combinations occur.

With one-level of look ahead bit-flipping is only allowed if the previous quantizer output $Q_p$, the current quantizer output $Q_o$ and the look-ahead quantizer output $Q_{1a}$ have the following bit-patterns:

| Qp | Qo | Q1a |
|----|----|-----|
| 0  | 1  | 0   |
| 1  | 0  | 1   |

With two-levels of look ahead bit-flipping is only allowed if the previous quantizer output Qp, the current quantizer output Qo, the look-ahead quantizer output Q1*a* and the 2-level look-ahead quantizer Q21*a* have the following bit-patterns:

| Qp | Qo | Q1a | Q21a |
|----|----|-----|------|
| 0  | 1  | 0   | X    |
| 1  | 0  | 1   | X    |
| 1  | 0  | 0   | 1    |
| 0  | 1  | 1   | 0    |

By flipping the current and next quantizer output, patterns such as 1100110011001100 can be bit-flipped to produce patterns 1111000011110000, causing a reduction in PRF when compared to one-level of look-ahead. Note that bit-flipping the next quantizer output occurs automatically by the algorithm on the next sample. For example the pattern 1001 is first flipped to 1101 on the current sample, then to 1111 on the next sample.

In a tri-level modulation embodiment, the quantizer can have outputs −1, 0, +1. Due to the bridge mode implementation (see FIG. 12), every transition across one state (−1 to 0 and vice-versa, or 0 to 1 and vice-versa) produces a transition in one switch only, whereas a transition across two states (from −1 to 1 and vice-versa) produces a transition in both switches.

The PRF control is a counter which on every sample counts up 1 if there is no transition between the previous and current sample, and down K if there is a transition in one switch, and down 2K if there is a transition in both switches. The output is TRUE if the counter value is less than zero (msb=1 in 2's complement arithmetic). This ensures that the average PRF across both switches is constant.

The circuit of FIG. 15 is modified in this case to include an additional input (−2K) for the selection multiplexer. The skilled person would then recognise that appropriate modifications need to be made to the derivation of tran.

The alternation control works in a similar way to the bi-level alternation control by constraining consecutive positive and negative flips. The only difference is that a positive flip is defined as a −1 to 1, −1 to 0 or 0 to 1 flip; and a negative flip is defined as a 1 to 0, 0 to 1 or 1 to 1 flip. As before, an alternation constraint A=1 enforces that each positive flip is followed by a negative flip and vice-versa. Similarly A=2 allows a maximum of two positive flips before enforcing that the next flip is negative. A state-machine can be used to implement this.

AS with bi-level bit-flipping, the transition control detects bit-patterns at the output of the quantizers $Q_p$, $Q_o$, $Q_{1a}$ and $Q_{21a}$ respectively, using combinatorial logic.

In the case of one-level of look-ahead, the transition control only allows bit-flipping if the effect of this will be to make Qp, Qo and Q1*a* equal. This implemented by outputting TRUE if Qp=Q1*a*, AND Qp≠Qo. In other words the following patterns are detected:

| Qp | Qo | Q1a |
|----|----|-----|
| 0  | 1  | 0   |
| 1  | 0  | 1   |
| 0  | −1 | 0   |
| −1 | 0  | −1  |
| −1 | 1  | −1  |
| 1  | −1 | 1   |

With two-levels of look ahead bit-flipping is only allowed if flipping both the current and next sample will make Qp, Qo, Q1*a* and Q21*a* equal. This is implemented by outputting TRUE if the following conditions are true:

(Qp=Q1*a*, AND Qp≠Qo)

OR (Qp≠Qo AND Qp=Q21*a*)

The first condition detects bit patterns such as {1,0,1} or {1, −1, 1)} which could be flipped to produce {1, 1, 1}.

The second condition detects bit-patterns such as {1,0,0, 1} or {1,0,−1,1} which could be flipped to produce {1, 1, 1, 1}.

Note that these are not the only possible implementations. For example, the alternation control could be modified that 1 to −1 and −1 to 1 flips are completely disallowed. This would further reduce the error introduced by bit-flipping, at the expense of a slight increase in PRF.

Weighted Bit Flipping

A drawback of the bit-flipping approach is that bit-flipping introduces additional noise in the baseband, resulting in a degradation in SNR. The noise can be reduced by increasing the order of the modulator. However this increases modulator complexity and cost.

As described above, the Alternation Control controls the error of the bit-flipping such that it has a high-pass characteristic. Unfortunately the quantizer error can interact with the bit-flipping error so that the advantages of the alternation control are reduced.

In a further embodiment, a weighted bit-flipping algorithm replaces the Alternation Control with an alternative algorithm which ensures that the error around the combined quantizer and bit-flipping unit becomes high-pass. This has the effect of minimising the bit-flipping error in the baseband and increasing the signal-to-noise ratio.

The weighted bit-flipping modulator is a variant on the BF modulator. It adapts the bit-flipping process according to an estimate of the noise power in the baseband. The idea is to only allow bit-flipping if the incurred baseband noise penalty is not too severe.

The noise power is the baseband is determined by finding the error introduced by the quantizer and BF unit, passing the error though a low-pass weighting filter, and determining the variance of the signal at the output. The decision is made to bit-flip only if the measured variance is smaller than a predetermined constant. This has a comparable effect to increasing the SNR of the modulator without increasing its order.

Figure 16:
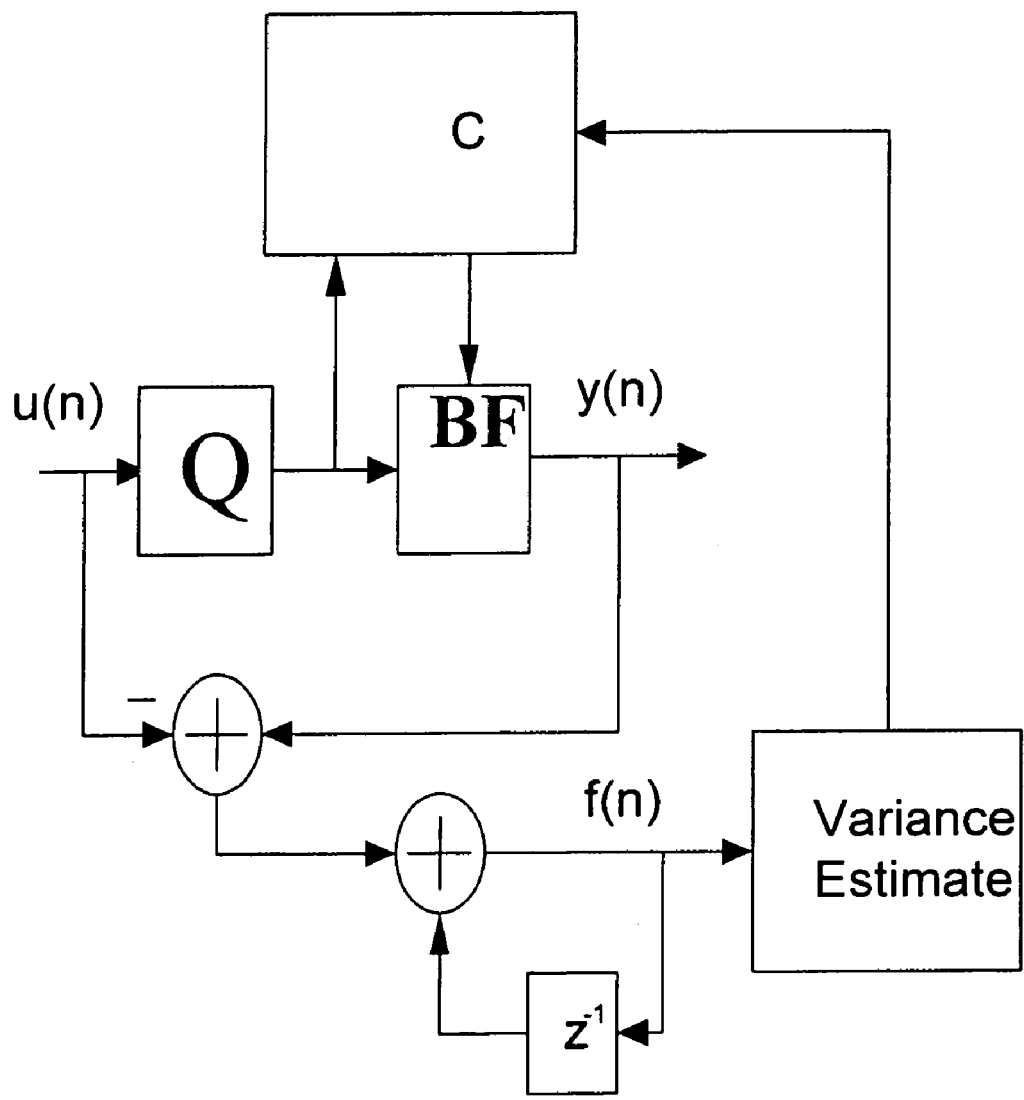
FIG. 16 is a circuit implementation for a weighted bit flipping algorithm according to an embodiment.

A circuit arrangement for finding the error is shown in FIG. 16. The error introduced by the quantizer and BF unit is found by subtracting the input to the quantizer u(n) from the output of the BF unit y(n). The baseband component of the error is found by passing it through a weighting filter—in this case a discrete-time integrator. The variance is found by squaring the filter output f(n) and finding the summation over time.

It can be shown that the increase in variance introduced by bit-flipping on the current sample is given by:

$$[f(n-1)-u(n)-y(n)]^2-[f(n-1)-u(n)+y(n)]^2=v(n) \quad \text{Equation 1}$$

A decision is made to bit-flip on the current sample if $$v(n)<B \quad \text{Equation 2}$$

where B is the predetermined constant.

The equation can be further manipulated to eliminate the square terms and allow more efficient implementation.

$$w(n)=4[f(n-1)-u(n)] \quad \text{Equation 3}$$

$$\text{Flip if: } (y(n)=1 \ \&\& \ w(n)>-B)||(y(n)=-1 \ \&\& \ w(n)<B) \quad \text{Equation 4}$$

Figure 17:
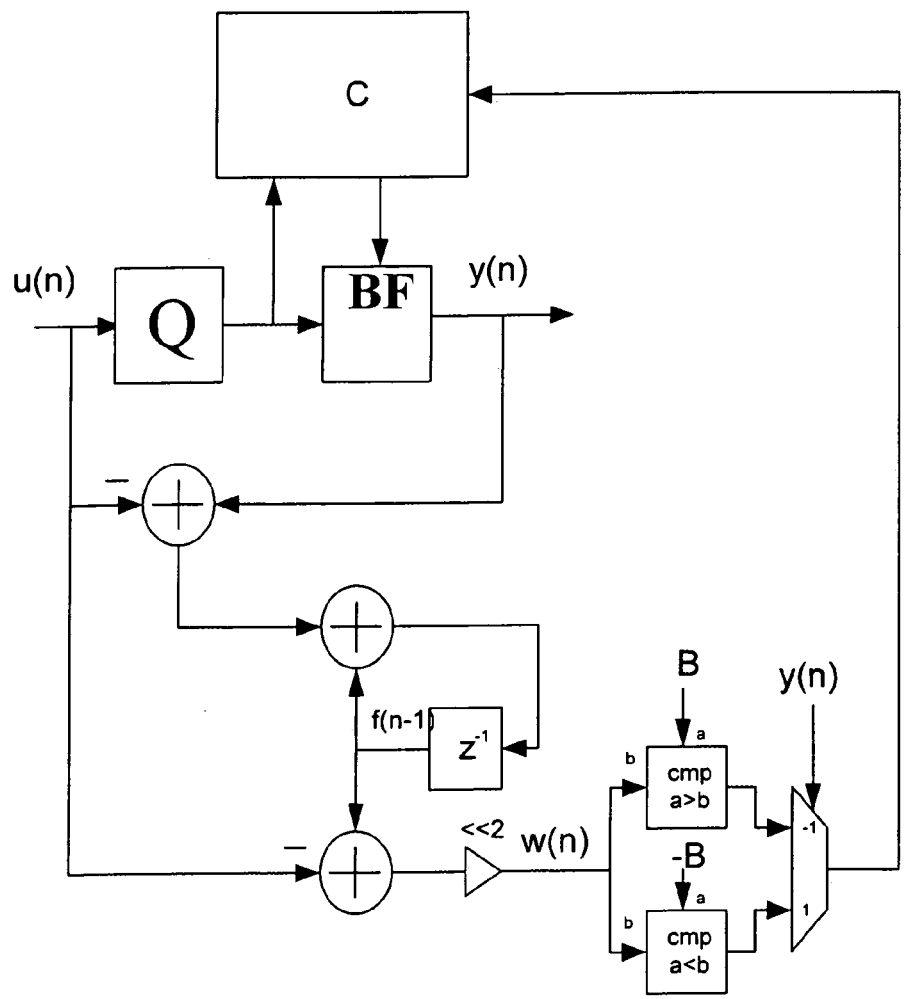
FIG. 17 is a circuit implementation for a weighted bit flipping algorithm according to another embodiment.

This implementation is shown in FIG. 17.

The signal arising from the above equation is passed as an additional input to the BF Control Unit. The signal is ANDed with the other conditions necessary for bit-flipping (e.g. the necessary look-ahead sequences), as described in more detail below.

Figure 18:
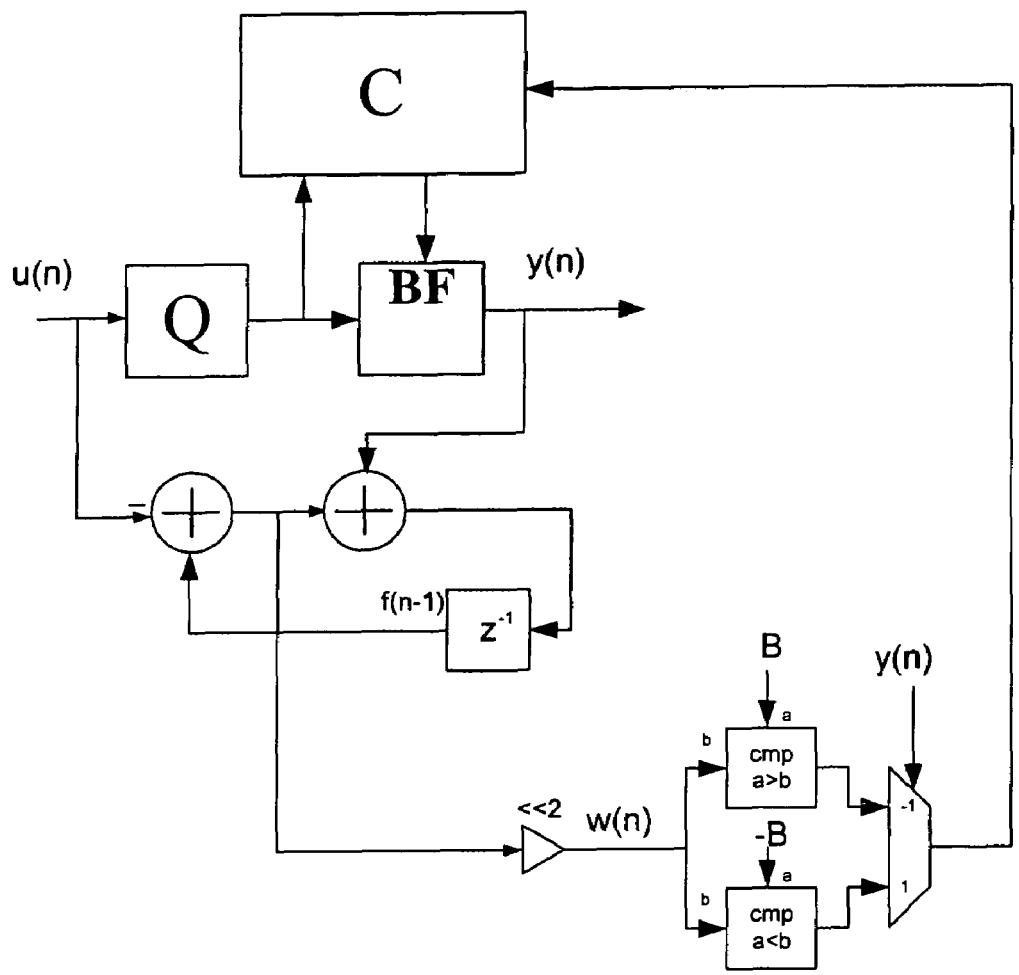
FIG. 18 is a circuit implementation for a weighted bit flipping algorithm according to a further embodiment.

The implementation shown in FIG. 17 requires 3 additional adders. A further and cheaper implementation is shown in FIG. 18, and requires only 2 additional adders.

The WBF algorithm causes the error spectrum of the quantizer and BF unit to be high-pass. Effectively, the algorithm introduces an additional zero in the noise-transfer function (NTF) of the modulator. This has a comparable effect to increasing the order of the modulator without increasing the SNR of the modulator without increasing its order. Therefore, a WBF modulator can be designed with the same transition bandwidth, but greater SNR.

The tradeoff is that the bit-flipping begins to turn off at high amplitudes. This is because the variance at the output of the weighting filter increases when the input signal increases, therefore according to Equation 4, bit-flipping is disallowed. The effect of turning off the bit-flipping is to increase the PRF at high amplitudes.

Figure 19:
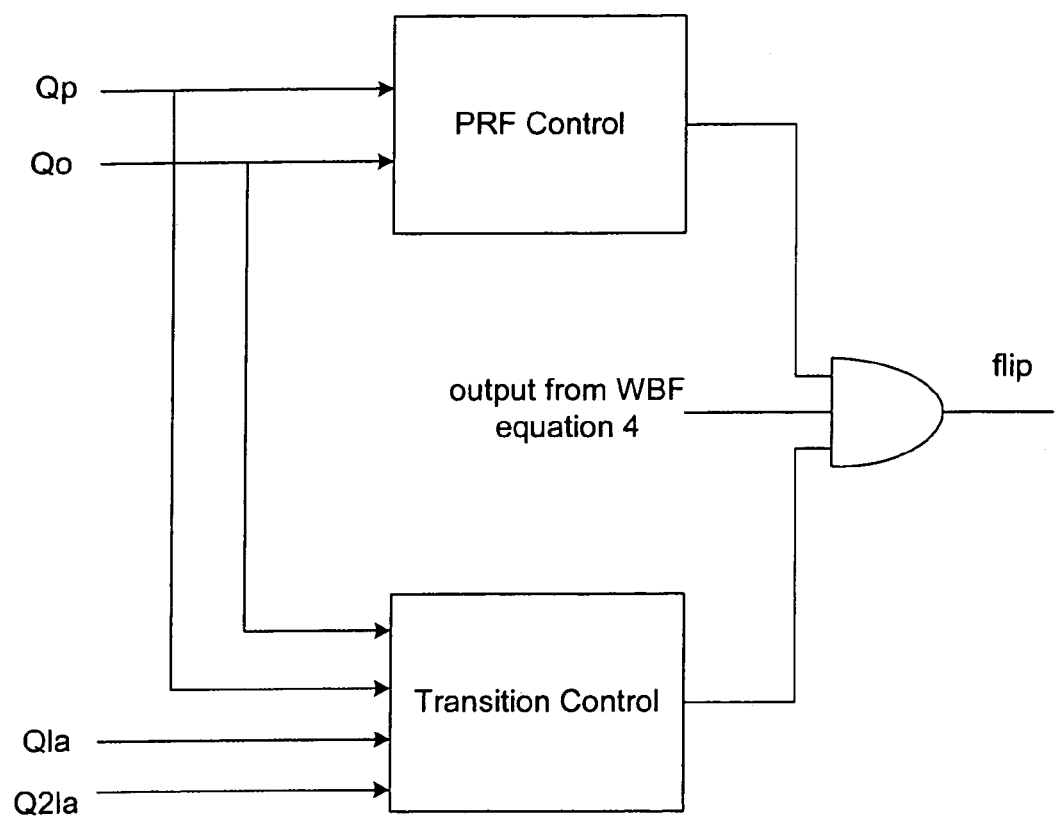
FIG. 19 is a schematic of a controller for a bit flipping modulator, modified to implement the weighted bit flipping algorithms of FIGS. 16-18.

Referring now to FIG. 19, the weighted bit-flipping controller determines whether bit-flipping is to occur on each sample. It has a set of conditions which must ALL be true for bit-flipping to occur:

1. PRF control
2. Transition Control
3. WBF control.

Conditions 1, and 2 are used in the standard bit-flipping algorithm as described above. Condition 3 is determined by equation 4 in the WBF Algorithm description.

Weighted bit flipping (WBF) provides a number of advantages, including increased SNR. In addition, at high input amplitudes the variance measured by the WBF algorithm increases, which causes bit-flipping activity to reduce. Consequently the stability of the modulator increases and hence the maximum signal level it can accept increases. Hence it is possible to increase the modulation index and maximum power of the amplifier.

The modifications over known structures shown in the above embodiments could equally be applied to other types of modulators such as a Trellis sigma-delta modulator for example. This applies equally to bi-level and tri-level implementations.

The skilled person will recognise that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional programmed code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analog array or similar device in order to configure analog hardware.

The skilled person will also appreciate that the various embodiments and specific features described with respect to them could be freely combined with the other embodiments or their specifically described features in general accordance with the above teaching. The skilled person will also recognise that various alterations and modifications can be made to specific examples described without departing from the scope of the appended claims.

The invention claimed is:

1. A bit-flipping sigma-delta modulator for a class d amplifier and comprising: a quantiser coupled to a bit-flipping means; one or more look-ahead quantisers; and a controller having inputs from the quantiser and the look-ahead quantiser and arranged to enable the bit-flipping means to provide a different output from that of the quantiser in order to reduce the quantised output transition rate of the modulator; a feedback circuit arranged to add a portion of the quantiser output to the input signal path of the modulator, and further comprising an integrator circuit in the input signal path between the input and the quantiser, the integrator circuit having a compensation circuit for adjusting the input to the quantiser when said previous modulator output has been changed by the bit flipping means from said previous quantiser output.

2. A modulator according to claim 1, said feedback circuit further arranged to add one or more additional portions of the quantiser output to the input signal path of the modulator, and further comprising one or more corresponding integrator circuits in the input signal path between the input and the quantiser, the integrator circuits each having a compensation circuit for adjusting the input to the quantiser when said previous quantiser output has been changed by the bit flipping means.

3. A modulator according to claim 1, said feedback circuit further arranged to add one or more additional portions of the output of the bit flipping means to the input signal path of the modulator, and further comprising one or more corresponding integrator circuits in the input signal path between the input and the quantiser.

4. A modulator according to claim 1 wherein said compensation circuit is arranged to adjust the input to the quantiser such that it is equivalent to a quantiser input having a feedback portion of a previous different output.

5. A modulator according to claim 4 wherein said compensation circuit is arranged to twice remove said feedback portion from the input signal path when said previous quantiser output has been changed by the bit flipping means.

6. A modulator according to claim 1 wherein said feedback circuit is a multiple feedback filter circuit having multiple feedback paths from the output of the quantiser and having couplings to the inputs of the quantisers.

7. A modulator according to claim 1 wherein said modulator is a bi-level or tri-level modulator.

8. A modulator according to claim 1 wherein said portion is provided by switchable predetermined coefficients, said switching controlled by the output of the quantiser.

9. A modulator according to claim 8 comprising a multiplexer coupled to an adder and arranged to switch between two coefficients depending on the output of the quantiser.

10. A modulator according to claim 1 wherein the compensating means comprises circuit means within the loop of a said integrator circuit to switchably add a compensation coefficient derived from said quantiser output.

11. A modulator according to claim 10 wherein the compensating means further comprises two switchable paths through the integrator loop, one of said paths comprising an adder to add said compensating coefficient, the coefficient and path depending on the output of the quantiser.

12. A modulator according to claim 1 further comprising a second look-ahead quantiser which determines the quantised output of said quantiser for the input sample two samples ahead, the controller further taking an input from said second look-ahead quantiser.

13. A modulator according to claim 1 wherein the controller comprises means for disabling the bit flipping means if the baseband noise resulting from enabling said bit flipping means is above a predetermined threshold.

14. A modulator according to claim 13 further comprising means for estimating the baseband noise as a result of enabling said bit flipping means, said estimate being dependent on the difference between the input of the quantiser and the output of the bit flipping means.

15. A modulator according to claim 14 wherein said noise estimate is dependant on the variance of the difference after baseband filtering.

16. A modulator according to claim 1 wherein the controller comprises: a transition rate counter which provides a control signal when the transition rate of the quantised modulator outputs is above a predetermined level; an alternation control which provides a control signal when consecutive ones of said output changes enabled by the bit flipping means are within a predetermined number of increases or decreases; a transition control which provides a control signal when the inputs from the quantiser and look-ahead quantisers correspond to predetermined patterns; wherein the controller enables the bit flipping means when a control signal is provided by the transition rate counter, the alternation control, and the transition control simultaneously.

17. A modulator according to claim 1 wherein the controller comprises: a transition rate counter which provides a control signal when the transition rate of the quantised modulator outputs is above a predetermined level; a weighted bit flipping control which provides a control signal when the baseband noise resulting from enabling said bit flipping means is below a predetermined threshold; a transition control which provides a control signal when the inputs from the quantiser and look-ahead quantisers correspond to predetermined patterns; wherein the controller enables the bit flipping means when a control signal is provided by the transition rate counter, the alternation control, and the transition control simultaneously.

18. A modulator according to claim 16 wherein the counter increments when there is no difference between current and previous quantiser output, and decrements by an amount dependent on the sampling frequency and maximum output transition rate when there is a difference between the current and previous quantiser output.

19. A modulator according to claim 18 wherein for a tri-level modulator, the decrement amount is doubled when the difference is between the highest and lowest outputs.

20. A modulator according to claim 16 wherein for a tri-level modulator, said predetermined patterns correspond to the previous quantiser output being equal to the look first ahead quantiser output and not equal to the current quantiser output, or the previous quantiser output not being equal to the current quantiser output and equal to the second look ahead quantiser output.

21. A class-d amplifier comprising a modulator according to claim 1.

* * * * *